(12) United States Patent
Hsieh et al.

(10) Patent No.: US 11,205,627 B2
(45) Date of Patent: Dec. 21, 2021

(54) SEMICONDUCTOR DEVICE PACKAGE INCLUDING EMITTING DEVICES AND METHOD OF MANUFACTURING THE SAME

(71) Applicant: Advanced Semiconductor Engineering, Inc., Kaohsiung (TW)

(72) Inventors: Meng-Wei Hsieh, Kaohsiung (TW); Kuo-Chang Kang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/789,243

(22) Filed: Feb. 12, 2020

(65) Prior Publication Data
US 2021/0249368 A1   Aug. 12, 2021

(51) Int. Cl.
| | |
|---|---|
| H01L 21/76 | (2006.01) |
| H01L 23/66 | (2006.01) |
| H01L 23/00 | (2006.01) |
| H01L 21/768 | (2006.01) |
| H01L 23/373 | (2006.01) |

(52) U.S. Cl.
CPC ............ H01L 23/66 (2013.01); H01L 21/768 (2013.01); H01L 23/3731 (2013.01); H01L 24/29 (2013.01); *H01L 2223/6677* (2013.01)

(58) Field of Classification Search
CPC ................. H01L 23/3731; H01L 24/29; H01L 2223/6677; H01L 23/66; H01L 21/768
USPC ......................................................... 257/768
See application file for complete search history.

(56) References Cited

U.S. PATENT DOCUMENTS

| | | | |
|---|---|---|---|
| 2018/0025999 A1 * | 1/2018 | Yu ......................... | H01L 23/485 257/428 |
| 2019/0035749 A1 * | 1/2019 | Dalmia ................. | H01L 23/552 |

* cited by examiner

*Primary Examiner* — Didarul A Mazumder
(74) *Attorney, Agent, or Firm* — Foley & Lardner LLP

(57) ABSTRACT

A semiconductor device package includes a first circuit layer, a first emitting device and a second emitting device. The first circuit layer has a first surface and a second surface opposite to the first surface. The first emitting device is disposed on the second surface of the first circuit layer. The first emitting device has a first surface facing the first circuit layer and a second surface opposite to the first surface. The first emitting device has a first conductive pattern disposed on the first surface of the first emitting device. The second emitting device is disposed on the second surface of the first emitting device. The second emitting device has a first surface facing the second surface of the first emitting device and a second surface opposite to the first surface. The second emitting device has a second conductive pattern disposed on the second surface of the emitting device. A coefficient of thermal expansion (CTE) of the first emitting device is greater than a CTE of the second emitting device.

19 Claims, 11 Drawing Sheets

SEMICONDUCTOR DEVICE PACKAGE INCLUDING EMITTING DEVICES AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is commonly used in an AiP system. However, due to the process limitation of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes a first circuit layer, a first emitting device and a second emitting device. The first circuit layer has a first surface and a second surface opposite to the first surface. The first emitting device is disposed on the second surface of the first circuit layer. The first emitting device has a first surface facing the first circuit layer and a second surface opposite to the first surface. The first emitting device has a first conductive pattern disposed on the first surface of the first emitting device. The second emitting device is disposed on the second surface of the first emitting device. The second emitting device has a first surface facing the second surface of the first emitting device and a second surface opposite to the first surface. The second emitting device has a second conductive pattern disposed on the second surface of the emitting device. A coefficient of thermal expansion (CTE) of the first emitting device is greater than a CTE of the second emitting device. In some embodiment, the CTE may be equivalent CTE.

In accordance with some embodiments of the present disclosure, a semiconductor device package includes a building-up circuit, a first emitting device and a second emitting device. The building-up circuit has a first surface and a second surface opposite to the first surface. The first emitting device is disposed on the second surface of the building-up circuit. The first emitting device has a first surface facing the building-up circuit and a second surface opposite to the first surface. The first emitting device has a first conductive pattern disposed on the first surface of the first emitting device. The second emitting device is disposed on the second surface of the first emitting device. The second emitting device has a first surface facing the second surface of the first emitting device and a second surface opposite to the first surface. The second emitting device has a second conductive pattern disposed on the second surface of the emitting device. A thickness of the second emitting device is greater than a thickness of the first emitting device.

In accordance with some embodiments of the present disclosure, a method of manufacturing an optical module includes (a) providing a first emitting device having a first conductive pattern; (b) providing a plurality of second emitting devices, each having a second conductive pattern; and (c) attaching the second emitting devices on the first emitting device.

Figure 1A:
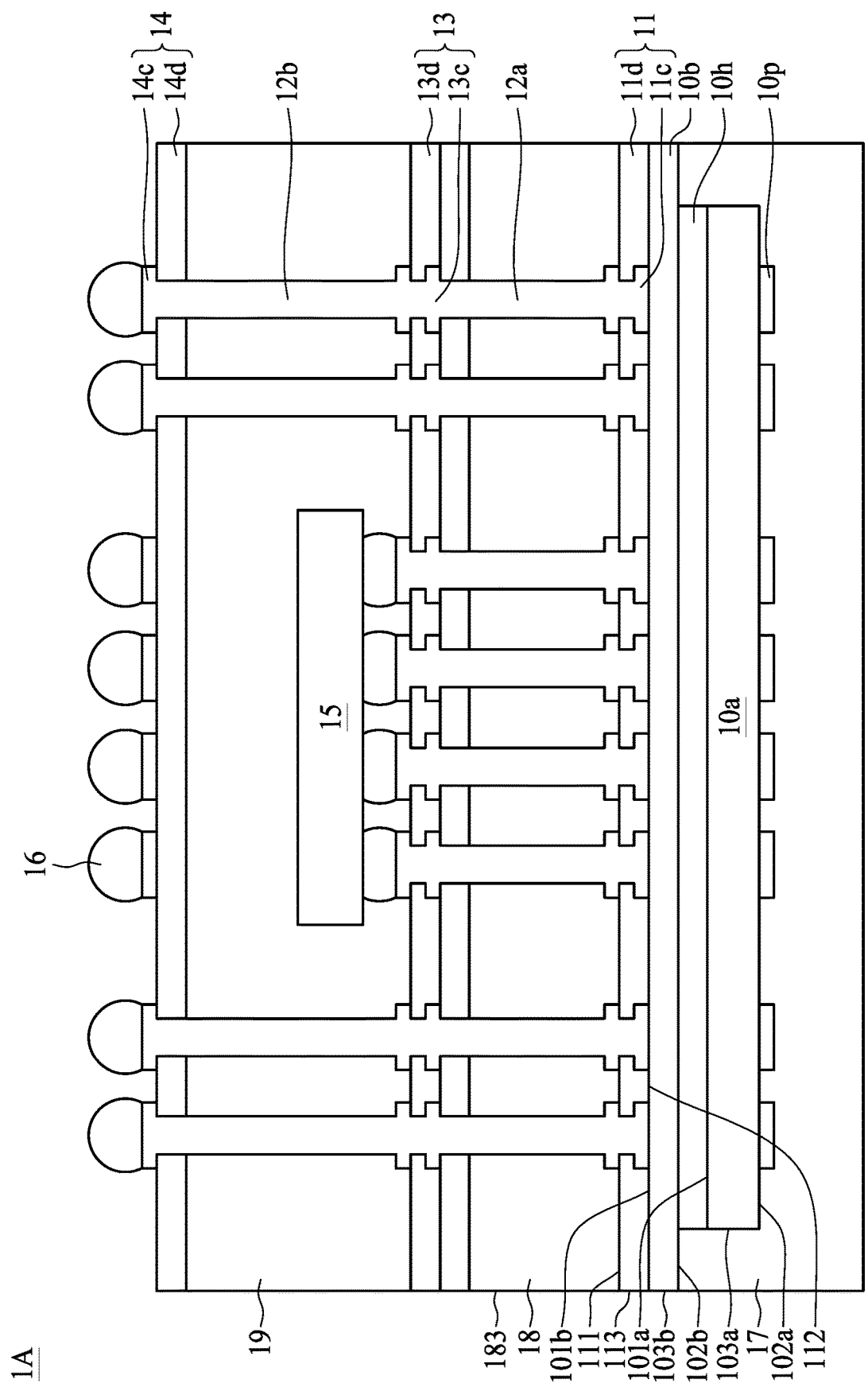
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1A in accordance with some embodiments of the present disclosure. The semiconductor device package 1A includes carriers 10a, 10b, circuit layers 11, 13, 14, interconnection structures 12a, 12b, an electronic component 15, electrical contacts 16 and package bodies 17, 18 and 19.

In some embodiments, the carrier 10a may be or include a glass substrate. In some embodiments, the carrier 10a may be or include an emitting device having one or more emitting components (e.g., an antenna, a light emitting device, a sensor or the like) disposed thereon. The carrier 10a may include conductive pad(s), trace(s), and interconnection(s) (e.g. via(s)). In some embodiments, the carrier 10a may include transparent material. In some embodiments, the carrier 10a may include opaque material. The carrier 10a includes a material having a dielectric constant (Dk) less than approximately 5. The carrier 10a includes a material having a Dk less than approximately 3. The carrier 10a includes a material having a loss tangent or dissipation factor (Df) less than approximately 0.005. The carrier 10a includes a material having a loss tangent or Df less than approximately 0.003.

The carrier 10a has a surface 101a, a surface 102a opposite to the surface 101a and a lateral surface 103a extending between the surface 101a and the surface 102a. Compared to the organic substrate, it is easier to control the thickness of a glass carrier, which can facilitate the miniaturization of the semiconductor device package 1A. In some embodiments, the thickness of the carrier 10a is equal to or less than about 400 μm. For example, the thickness of the carrier 10a is in a range from about 50 μm to about 400 μm. For example, the thickness of the carrier 10a is in a range from about 100 μm to about 300 μm. In some embodiments, a coefficient of thermal expansion (CTE) of the carrier 10a is in a range from about 0.5 to about 13. In some embodiments, the CTE of the carrier 10a is in a range from about 3.6 to about 8.5.

A conductive layer 10p is disposed on the surface 102a of the carrier 10a. In some embodiments, the conductive layer 10p defines a patterned antenna, such as a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the conductive layer 10p may be replaced by one or more light emitting devices or sensors.

The carrier 10b is disposed on the surface 101a of the carrier 10a. The carrier 10b has a surface 101b facing away from the carrier 10a, a surface 102b opposite to the surface 101b and a lateral surface 103b extending between the surface 101b and the surface 102b. The surface 102b of the carrier 10b is connected to the surface 101a of the carrier 10a through an adhesive layer 10h (e.g., a tape, a glue or a die attach film (DAF)). The carrier 10b is spaced apart from the carrier 10a. For example, there is a distance (e.g., a thickness of the adhesive layer 10a) between the surface 101a of the carrier 10a and the surface 102b of the carrier 10b. In some embodiments, the lateral surface 103a of the carrier 10a and the lateral surface 103b of the carrier 10b are noncoplanar or discontinuous. For example, the lateral surface 103a of the carrier 10a is recessed from the lateral surface 103b of the carrier 10b. For example, a width of the carrier 10a is less than a width of the carrier 10b. In some embodiments, a roughness of the lateral surface 103a of the carrier 10a is less than a roughness of the lateral surface 103b of the carrier 10b. In some embodiments, the carrier 10b and a portion of the circuit layer 11 (e.g., a conductive layer of the circuit layer adjacent to the carrier 10b) may be also referred to as a first emitting device.

In some embodiments, the carrier 10b and the carrier 10a may include the same thickness. Alternatively, the carrier 10b and the carrier 10a may include different thicknesses. For example, the thickness of the carrier 10a can be equal to, greater than or less than the thickness of the carrier 10b. In some embodiments, a sum of the thickness of the carrier 10a and the thickness of the carrier 10b may be equal to or less than about 400 μm. For example, the thickness of the carrier 10a may be about 350 μm and the thickness of the carrier 10b may be about 50 μm. For example, the thickness of the carrier 10a may be about 300 μm and the thickness of the carrier 10b may be about 100 μm. For example, the thickness of the carrier 10a may be about 250 μm and the thickness of the carrier 10b may be about 150 μm.

In some embodiments, the carrier 10b and the carrier 10a may include the same material. Alternatively, the carrier 10b and the carrier 10a may include different materials. In some embodiments, the CTE of the carrier 10b is higher than the CTE of the carrier 10a. In some embodiments, the hardness of the carrier 10b is higher than the hardness of the carrier 10a. By disposing a carrier 10b having a relatively higher CTE and hardness between the carrier 10a and the circuit layer 11, the warpage issue caused due to the CTE mismatch between the carrier 10b and the package body 17 (or the package body 18) can be mitigated. In some embodiments, the Dk of the carrier 10a is lower than the Dk of the carrier 10b. By choosing the carrier 10a having the relatively lower Dk, the electrical performance of the antenna pattern (e.g., the conductive layer 10p) can be improved. This would increase the flexibility to design the semiconductor device package 1A.

The package body 17 is disposed on the surface 102b of the carrier 10b. The package body 17 covers the carrier 10a and the conductive layer 10p. The package body 17 covers the surface 102a and the lateral surface 103a of the carrier 10a and a lateral surface of the adhesive layer 10h. In some embodiments, the package body 17 has a lateral surface 173 substantially coplanar with the lateral surface 103b of the carrier 10b. The lateral surface 103a of the carrier 10a is recessed from the lateral surface 173 of the package body 17. For example, there is a distance between the lateral surface 103a of the carrier 10a and the lateral surface 173 of the package body 17. In some embodiments, the package body 17 includes an epoxy resin including fillers, a molding compound (e.g., an epoxy molding compound or other molding compound), a polyimide, a phenolic compound or material, a material including a silicone dispersed therein, or a combination thereof.

The circuit layer 11 (or building-up circuit) has a surface 111 facing away from the carrier 10b, a surface 112 opposite to the surface 111 and a lateral surface 113 extending between the surface 111 and the surface 112. The circuit layer 11 is disposed on the surface 101b of the carrier 10b. In some embodiments, the circuit layer 11 is in contact with the carrier 10b. Alternatively, the circuit layer 11 can be connected to the carrier 10b through an adhesive layer (e.g., DAF). In some embodiments, the lateral surface 113 of the circuit layer 11 is substantially coplanar with the lateral surface 103b of the carrier 10b.

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. In some embodiments, the exposed portion of the conductive layer 11c has a surface facing the carrier 10b and in contact with the surface 101b of the carrier 10b. In some embodiments, the conductive layer 11c may be or include one or more antenna patterns, light emitting devices, sensors or the like.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c and dielectric layers 11d depending on design specifications. In some embodiments, the conductive layer 11c is formed of or includes Au, Ag, Cu, Pt, Pd, or an alloy thereof.

One or more interconnection structures 12a (e.g., conductive pillars or conductive elements) are disposed on the surface 111 of the circuit layer 11. The interconnection structures 12a are electrically connected to the circuit layer 11 (i.e., to the conductive layer 11c exposed from the dielectric layer 11d). In some embodiments, the interconnection structures 12a define an antenna structure. The interconnection structure 12a is, or includes, a conductive material such as a metal or metal alloy. Examples of the conductive material include Au, Ag, Cu, Pt, Pd, or an alloy thereof.

The package body 18 is disposed on the surface 111 of the circuit layer 11. The package body 18 covers the interconnection structures 12a. In some embodiments, the package body 18 has a lateral surface 183 substantially coplanar with the lateral surface 113 of the circuit layer 11. In some embodiments, the package body 18 includes an epoxy resin including fillers, a molding compound (e.g., an epoxy molding compound or other molding compound), a polyimide, a phenolic compound or material, a material including a silicone dispersed therein, or a combination thereof.

The circuit layer 13 (or building-up circuit) is disposed on the package body 18. The circuit layer 13 has a dielectric layer 13d and a conductive layer 13c. In some embodiments, the dielectric layer 13d may include the same material as the dielectric layer 11d. Alternatively, the dielectric layer 13d and the dielectric layer 11d may include different materials. The circuit layer 13 is electrically connected to the interconnection structures 12a. For example, the conductive layer 13c of the circuit layer 13 is in contact with the interconnection structures 12a. Alternatively, there is a seed layer disposed between the conductive layer 13c and the interconnection structures 12a. In some embodiments, there may be any number of conductive layers 13c and dielectric layers 13d depending on design specifications.

One or more interconnection structures 12b (e.g., conductive pillars or conductive elements) are disposed on a surface of the circuit layer 13 facing away from the circuit layer 11. The interconnection structures 12b are electrically connected to the circuit layer 13. The interconnection structure 12b is, or includes, a conductive material such as a metal or metal alloy. Examples of the conductive material include Au, Ag, Cu, Pt, Pd, or an alloy thereof.

The package body 19 is disposed on the surface of the circuit layer 13 facing away from the circuit layer 11. The package body 19 covers the interconnection structures 12b and the electronic component 15. In some embodiments, the package body 19 has a lateral surface substantially coplanar with the lateral surface of the circuit layer 13. In some embodiments, the package body 19 includes an epoxy resin including fillers, a molding compound (e.g., an epoxy molding compound or other molding compound), a polyimide, a phenolic compound or material, a material including a silicone dispersed therein, or a combination thereof.

The circuit layer 14 (or building-up circuit) is disposed on the package body 19. The circuit layer 14 has a dielectric layer 14d and a conductive layer 14c. In some embodiments, the dielectric layer 14d may include the same material as the dielectric layer 11d. Alternatively, the dielectric layer 14d and the dielectric layer 11d may include different materials. The conductive layer 14c is electrically connected to the interconnection structures 12b. For example, the conductive layer 14c of the circuit layer 14 is in contact with the interconnection structures 12b. Alternatively, there is a seed layer disposed between the conductive layer 14c and the interconnection structures 12b. In some embodiments, there may be any number of conductive layers 14c and dielectric layers 14d depending on design specifications.

The electronic component 15 is disposed on a surface of the circuit layer 13 facing away from the circuit layer 11. The active surface of the electronic component 15 faces the circuit layer 13. The electronic component 15 is electrically connected to the circuit layer 13 (e.g., to the conductive layer 13c) through electrical contacts (e.g., solder balls), and the electrical connection can be achieved by, for example, flip-chip technique. The electronic component 15 may be an active electronic component, such as an integrated circuit (IC) chip or a die.

The electrical contacts 16 are disposed on the conductive layer 14c exposed from the dielectric layer 14d. In some embodiments, the electrical contacts 16 may include solder or other suitable material(s).

In some embodiments, the lateral surface 103a of the carrier 10a may be coplanar with the lateral surface 103b of the carrier 10b. For example, the lateral surface 103a of the carrier 10a is exposed from the package body 17. Such structure may be formed by: (i) providing a glass wafer; (ii) forming the circuit layers 11, 13, 14, the interconnection structures 12a, 12b and the package bodies 17, 18, 19 and the electronic component 15 on the glass wafer; and (iii) performing a singulation through the circuit layers 11, 13, 14, the package bodies 17, 18, 19 and the carrier wafer. To meeting the requirement of the performance of the antenna structure, the glass wafer should select a material having a relatively low Dk (e.g., less than 5). However, a glass wafer having a relatively low Dk would have a relatively low CTE as well (e.g., less than 13). Due to a CTE mismatch between the glass wafer and the package body 17 (e.g., the package body generally has a CTE greater than 20), the warpage issues would occur. As the size of the glass wafer increases, the warpage issue becomes severer, which may result in the crack or damage of the glass wafer.

In accordance with the embodiments as shown in FIG. 1A, the lateral surface 103a of the carrier 10a is recessed from the lateral surface 103b of the carrier 10b. Such structure may be formed by (detailed operations would be described later): (i) performing a singulation for a glass wafer to divide the glass wafer into a plurality glass carriers (e.g., the carrier 10a as shown in FIG. 1A); (ii) forming the carrier 10b, the circuit layers 11, 13, 14, the interconnection structures 12a, 12b and the package bodies 17, 18, 19 and the electronic component 15; and (iii) attaching the carrier 10a on the carrier 10b through the adhesive layer 10h. Since the size of the divided glass carrier is much less than that of the glass wafer, the warpage issue can be significantly mitigated. In addition, since it is unnecessary to select a material of the carrier 10a having a higher CTE to be close to the CTE of the package body 17, materials having lower CTE (also having lower Dk) can be selected as the carrier 10a. This would enhance the performance of the antenna structure of the semiconductor device package 1A. Furthermore, the thickness of the carrier 10a can be reduced as well, which would facilitate the miniaturization of the semiconductor device package 1A.

Figure 1B:
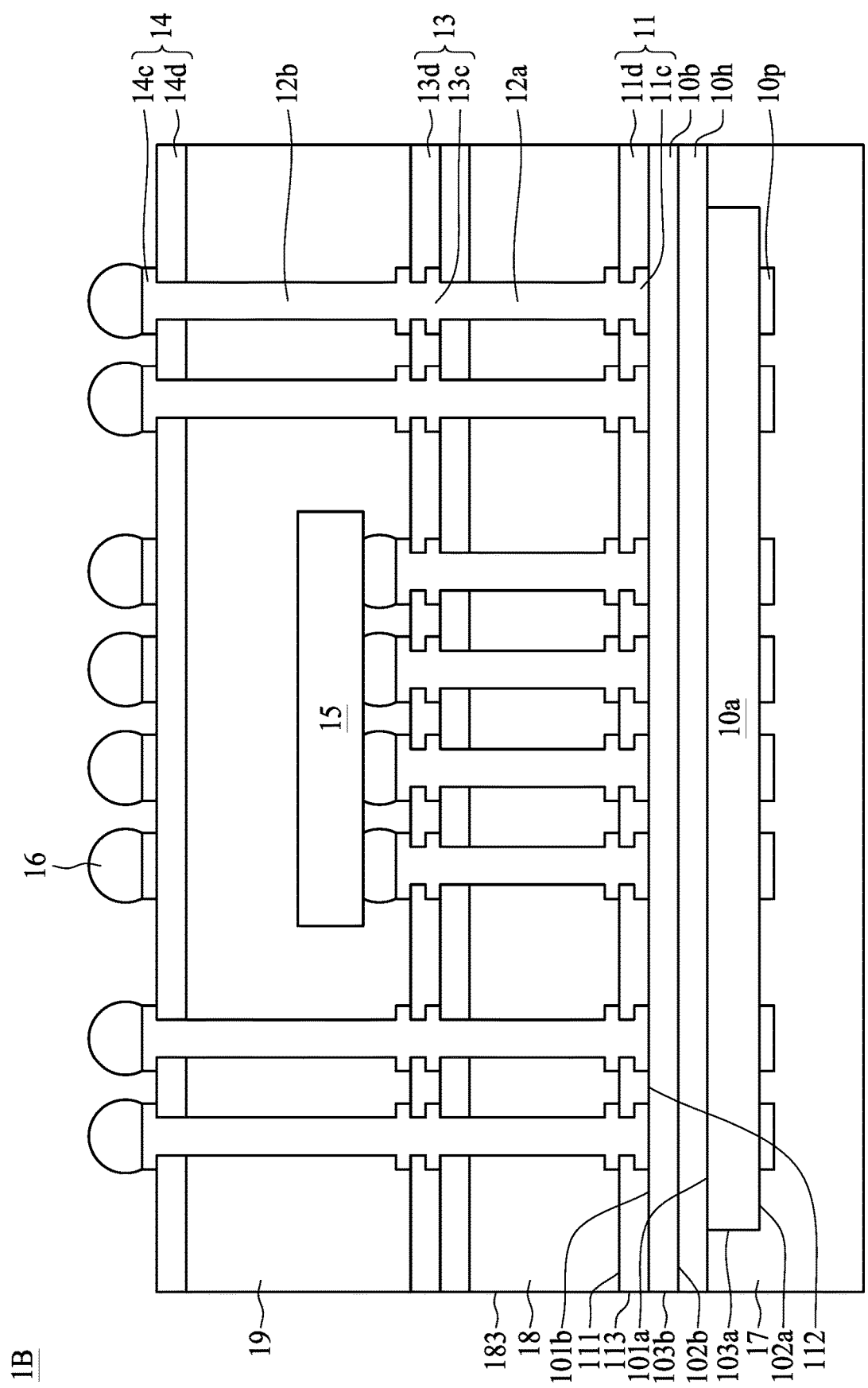
FIG. 1B illustrates a cross-sectional view of a semiconductor device package in accordance with some embodiments of the present disclosure.

FIG. 1B illustrates a cross-sectional view of a semiconductor device package 1B in accordance with some embodiments of the present disclosure. The semiconductor device package 1B is similar to the semiconductor device package 1A as shown in FIG. 1A, and one of the differences therebetween is that in FIG. 1B, a width of the adhesive layer 10h is greater than a width of the carrier 10a. For example, a lateral surface of the adhesive layer 10h is substantially coplanar with the lateral surface 103b of the carrier 10b. For example, the lateral surface 103a of the carrier 10a is recessed from the lateral surface of the adhesive layer 10h. This would increase the accuracy of the alignment between the carrier 10a and the carrier 10b during the manufacturing process.

Figure 2A:
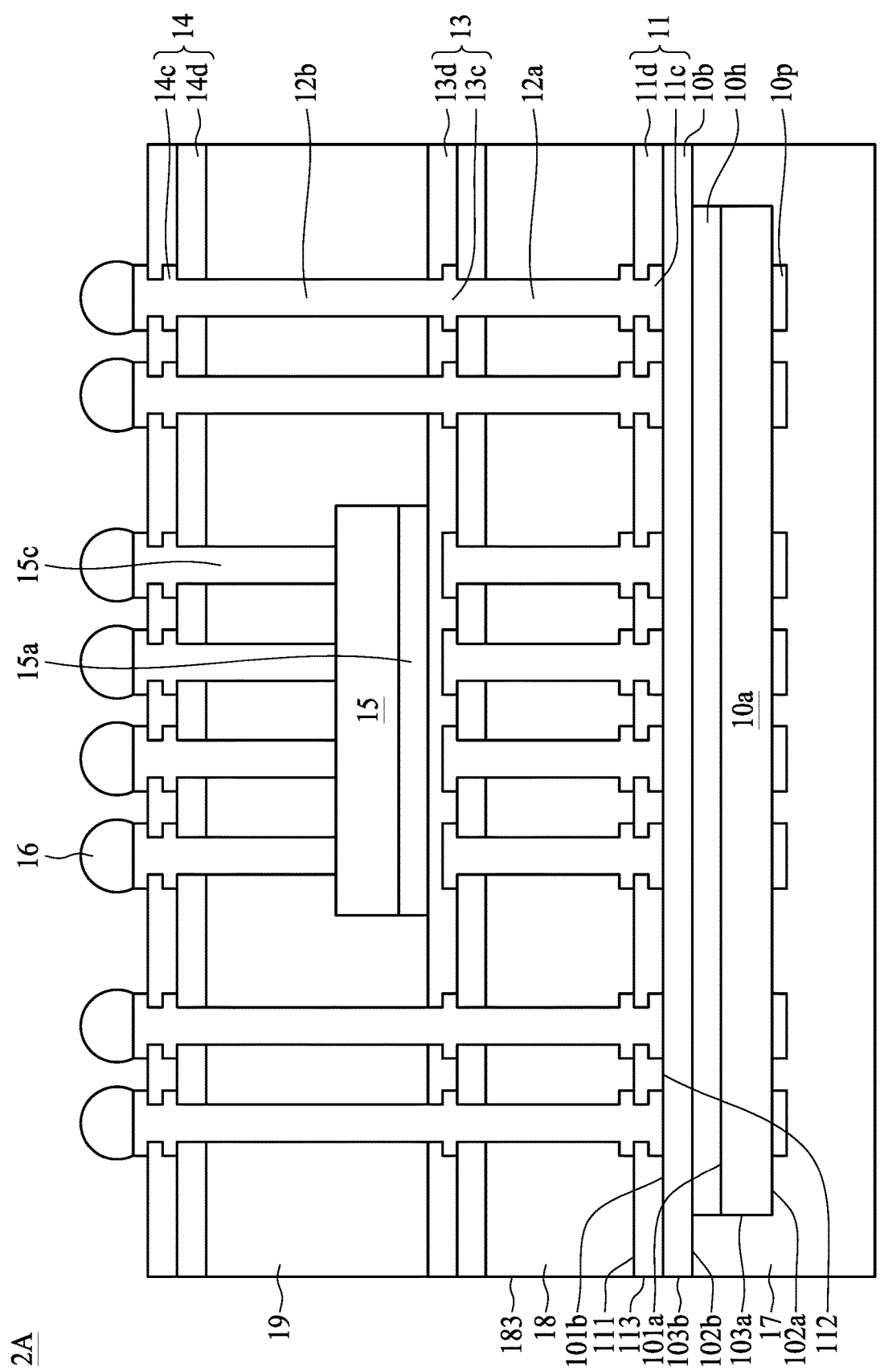
FIG. 2A illustrates a cross-sectional view of a semiconductor device package in accordance with some embodiments of the present disclosure.

FIG. 2A illustrates a cross-sectional view of a semiconductor device package 2A in accordance with some embodiments of the present disclosure. The semiconductor device package 2A is similar to the semiconductor device package 1A as shown in FIG. 1A, and the differences therebetween are described below.

The electronic component 15 is disposed on a surface of the circuit layer 13 facing away from the circuit layer 11. The backside surface of the electronic component 15 is connected to the circuit layer 13 through an adhesive layer 15a (e.g., DAF). The electronic component 15 is electrically connected to the circuit layer 14 (e.g., to the conductive layer 14c) through the interconnection structures 15c (e.g., Cu pillars).

Figure 2B:
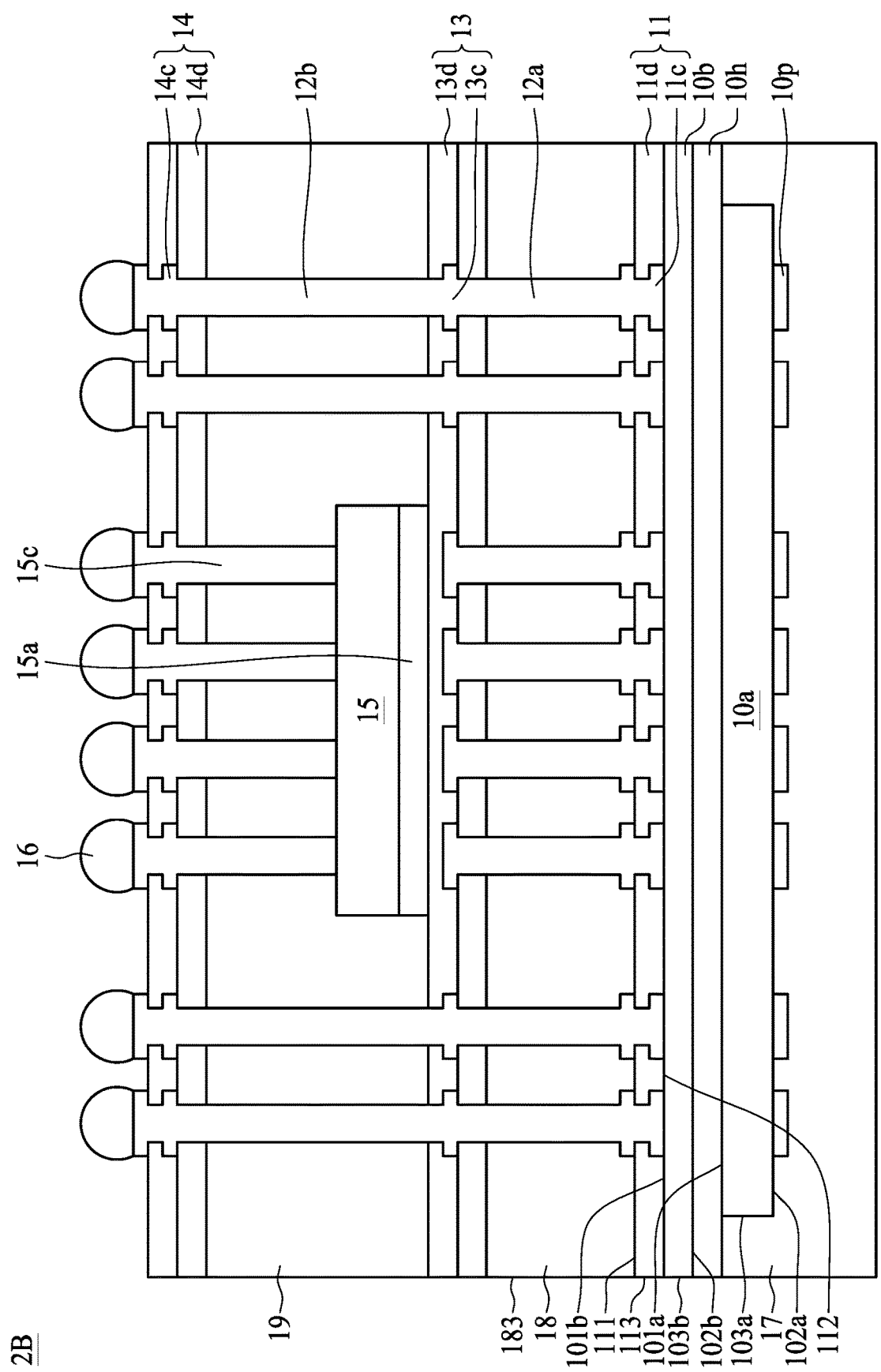
FIG. 2B illustrates a cross-sectional view of a semiconductor device package in accordance with some embodiments of the present disclosure.

FIG. 2B illustrates a cross-sectional view of a semiconductor device package 2B in accordance with some embodiments of the present disclosure. The semiconductor device package 2B is similar to the semiconductor device package 2A as shown in FIG. 2A, and one of the differences therebetween is that in FIG. 2B, a width of the adhesive layer 10h is greater than a width of the carrier 10a. For example, a lateral surface of the adhesive layer 10h is substantially coplanar with the lateral surface 103b of the carrier 10b. For example, the lateral surface 103a of the carrier 10a is recessed from the lateral surface of the adhesive layer 10h. This would increase the accuracy of the alignment between the carrier 10a and the carrier 10b during the manufacturing process.

Figure 3:
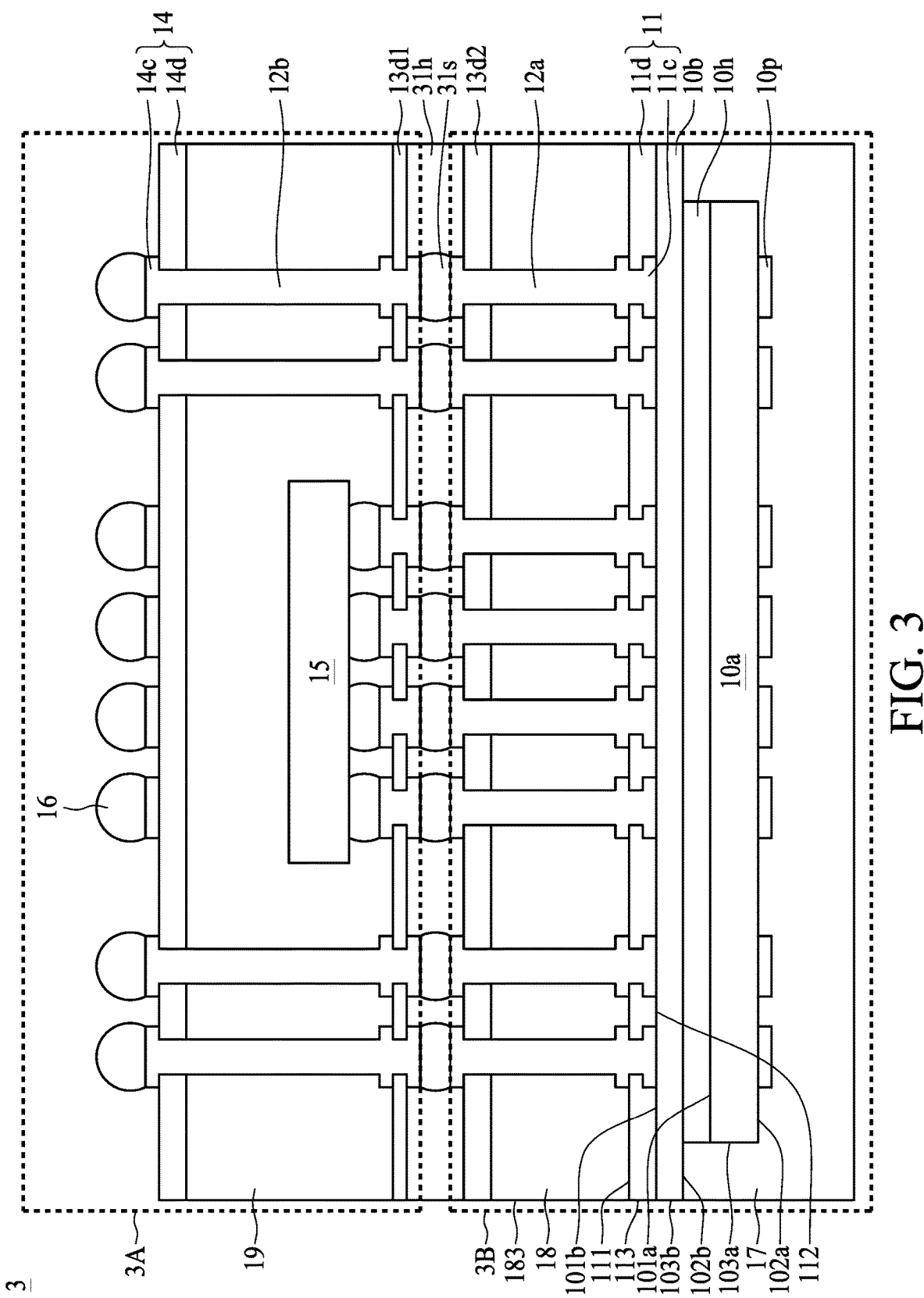
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1B as shown in FIG. 1B, and the differences therebetween are described below.

The semiconductor device package 3 may include two parts 3A and 3B. The part 3A includes the dielectric layer 13d1, the package body 19, the electronic component 15, the circuit layer 14, the interconnection structures 12b and the electrical contacts 16. The part 3B includes the dielectric layer 13d2, the package bodies 17, 18, the circuit layer 11, the carriers 10a and 10b. The part 3A and the part 3B may be manufactured individually and then connected to each other through electrical contacts 31s (e.g., solder balls). This would increase the yield rate of the semiconductor device package 3. In some embodiments, an underfill 31h may be disposed between the part 3A and the part 3B to cover the electrical contacts 31s. In some embodiments, a width of the part 3A is the same as a width of the part 3B. Alternatively, the width of the part 3A may be greater than or less than the width of the part 3B depending on design specifications.

Figure 4:
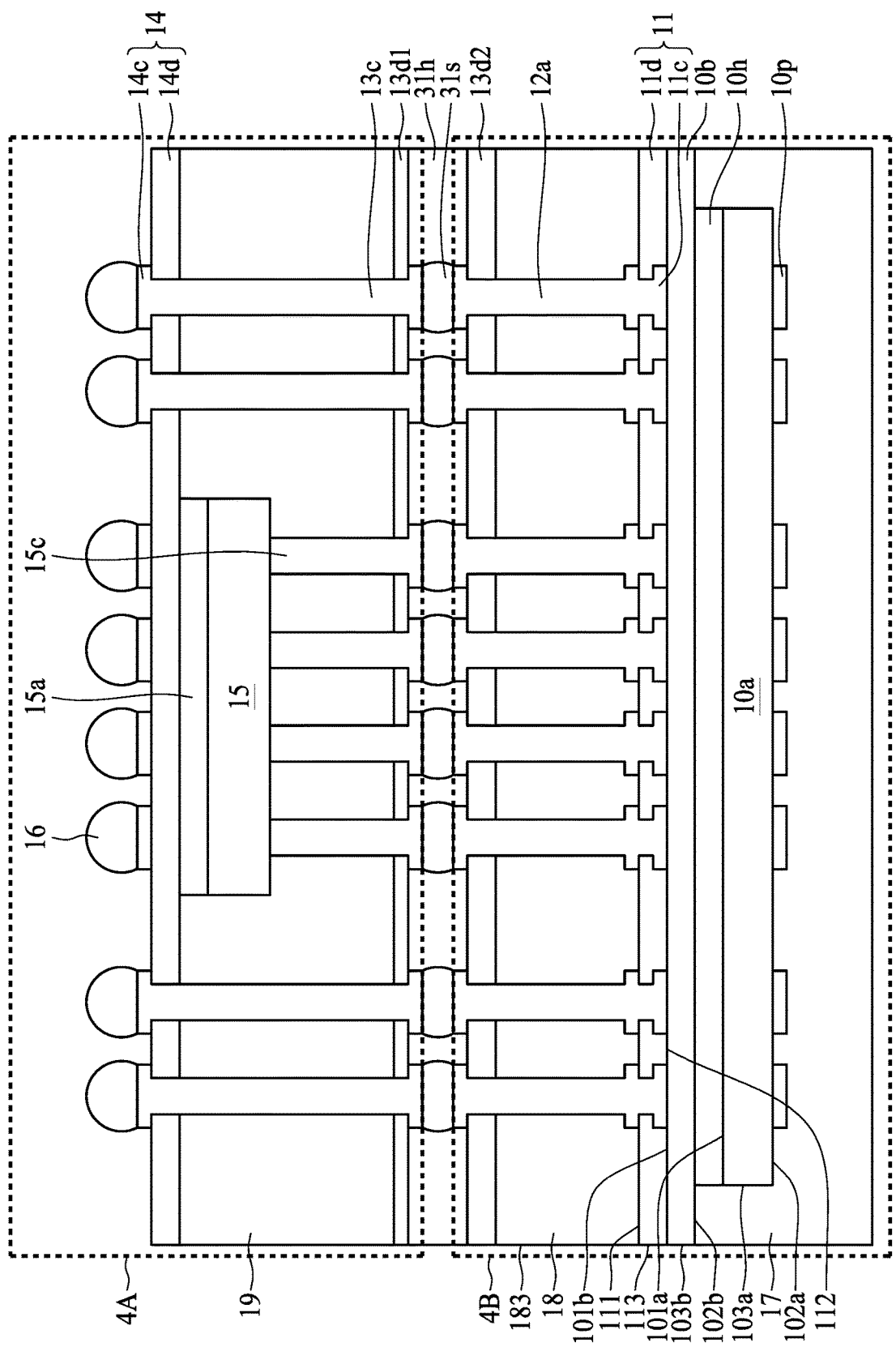
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 as shown in FIG. 3, and the differences therebetween are described below.

The semiconductor device package 4 may include two parts 4A and 4B. The part 4B is similar to the part 3B of the semiconductor device package 3 in FIG. 3. The part 4A is similar to the part 3A of the semiconductor device package 3 in FIG. 3 except that in the part 4A of the semiconductor device package 4 in FIG. 4, the electronic component 15 is disposed on a surface of the circuit layer 14 facing the dielectric layer 13d2. The backside surface of the electronic component 15 is connected to the surface of the circuit layer 14 through the adhesive layer 15a. The active surface of the electronic component 15 is electrically connected to the conductive layer 13c through the interconnection structures 15c (e.g., Cu pillars). In some embodiments, a width of the part 4A is the same as a width of the part 4B. Alternatively, the width of the part 4A may be greater than or less than the width of the part 4B depending on design specifications.

FIG. 5A, FIG. 5B, FIG. 5C, FIG. 5D and FIG. 5E illustrate a semiconductor manufacturing method in accordance with some embodiments of the present disclosure. In some embodiments, the method in FIG. 5A, FIG. 5B, FIG. 5C, FIG. 5D and FIG. 5E can be used to manufacture the semiconductor device package 1A in FIG. 1A.

Figure 5A:
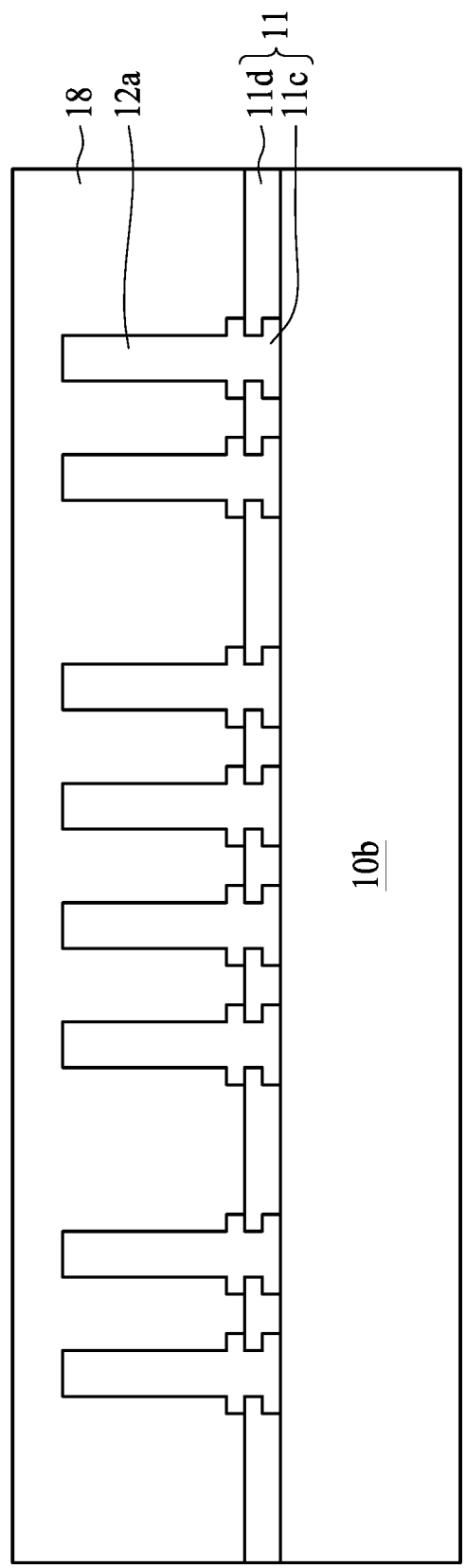
FIG. 5A, FIG. 5B, FIG. 5C, FIG. 5D and FIG. 5E illustrate a semiconductor manufacturing method in accordance with some embodiments of the present disclosure.

Referring to FIG. 5A, a carrier 10b is provided. The substrate 10b may be in a wafer type, a panel type or a strip type. A circuit layer 11 including one or more conductive layers 11c and one or more dielectric layers 11d is formed on the carrier 10b. Interconnection structures 12a are formed on the circuit layer 11 to be electrically connected to the circuit layer 11 (e.g., connected to a portion of the conductive layer 11c exposed from the dielectric layer 11d). The dielectric layer 11d is formed by, for example but is not limited to, photolithographic technique. In some embodiments, the interconnection structures 12a may be formed by, for example but is not limited to, plating technique.

A package body 18 is then formed on the circuit layer 11 to cover the interconnection structures 12a. In some embodiments, the package body 18 may be formed to fully cover the interconnection structures 12a. In some embodiments, the package body 18 is formed by, for example, by a transfer molding technique, a compression technique or any other suitable techniques.

Figure 5B:
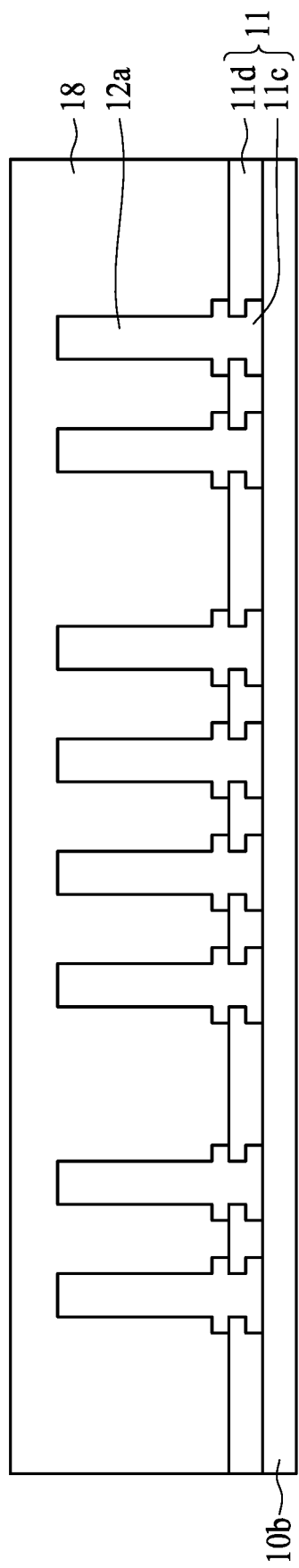

Referring to FIG. 5B, a portion of the carrier 10b is removed by, for example, grinding or any other suitable processes to reduce the thickness of the carrier 10b. In some embodiments, the thinning operation is carried out from a surface of the carrier 10b facing away the circuit layer 11. In some embodiments, after the thinning operation, the thickness of the carrier 10b is equal to or less than 200 μm. For example, the thickness of the carrier 10b is equal to or less than 100 μm. For example, the thickness of the carrier 10b is equal to or less than 50 μm.

Figure 5C:
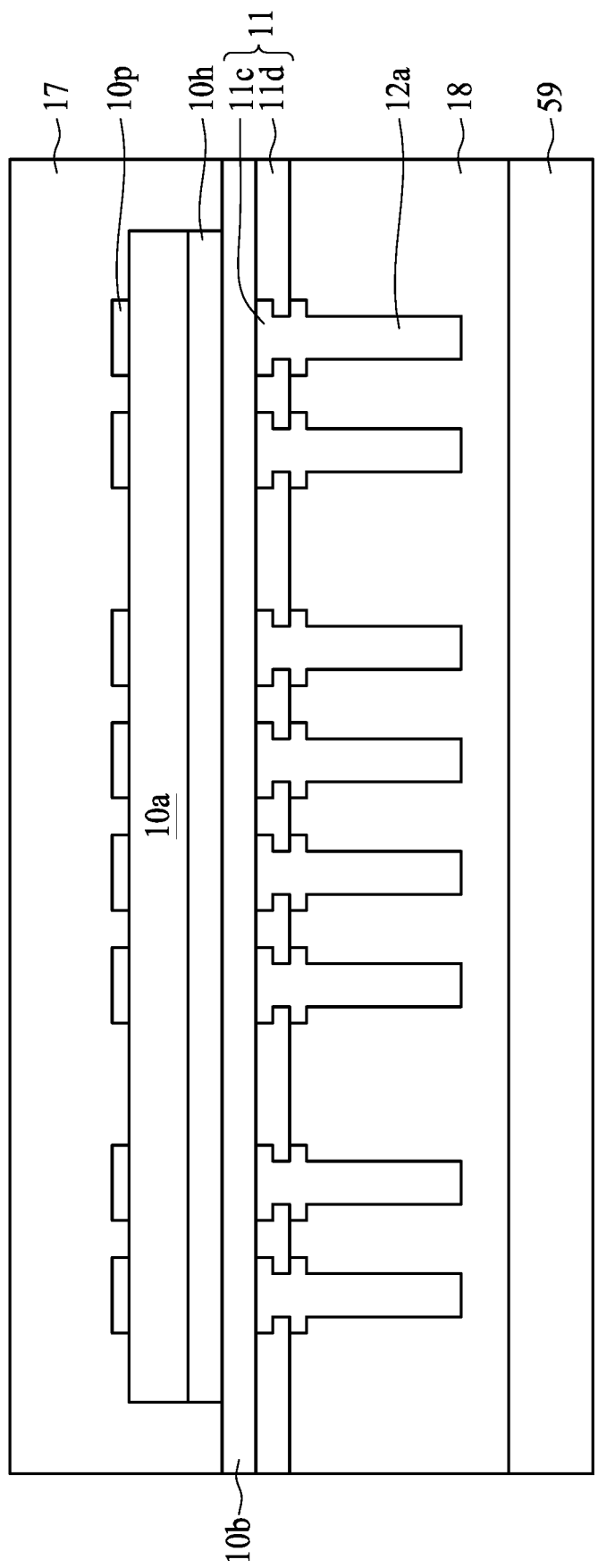

Referring to FIG. 5C, the package body 18 is disposed on a carrier 59. The package body 18 may be attached to the carrier 59 through an adhesive layer (e.g., a tape or a glue). A carrier 10a having a conductive layer 10p thereon is disposed on the carrier 10b. In some embodiments, the carrier 10a is attached to the carrier 10b through an adhesive layer 10h. In some embodiments, the carrier 10a may be formed by performing a singulation to divide a glass wafer into a plurality of glass carriers including the carrier 10a. In some embodiments, the thickness of the carrier 10a is equal to or greater than 200 μm. For example, the thickness of the carrier 10a is equal to or greater than 300 μm. For example, the thickness of the carrier 10a is equal to or greater than 350 μm.

A package body 17 is then formed on the carrier 10b to cover the carrier 10a and the conductive layer 10p. In some embodiments, the package body 17 is formed by, for example, by a transfer molding technique, a compression technique or any other suitable techniques. Since the carrier 10b has the relatively thinner thickness (compared with the carrier 10a), the warpage issue caused by the CTE mismatch between the carrier 10b and the package body 17 can be mitigated even if the carrier 10b may be in a wafer type, a panel type or a strip type. In addition, since the carrier 10a is connected to the carrier 10b after dividing a carrier wafer into a plurality of carriers including the carrier 10a, the size of the divided carrier is much less than that of the carrier wafer. Hence, the warpage issue caused by the CTE mismatch between the package body 17 and the carrier 10a can be significantly mitigated.

Figure 5D:
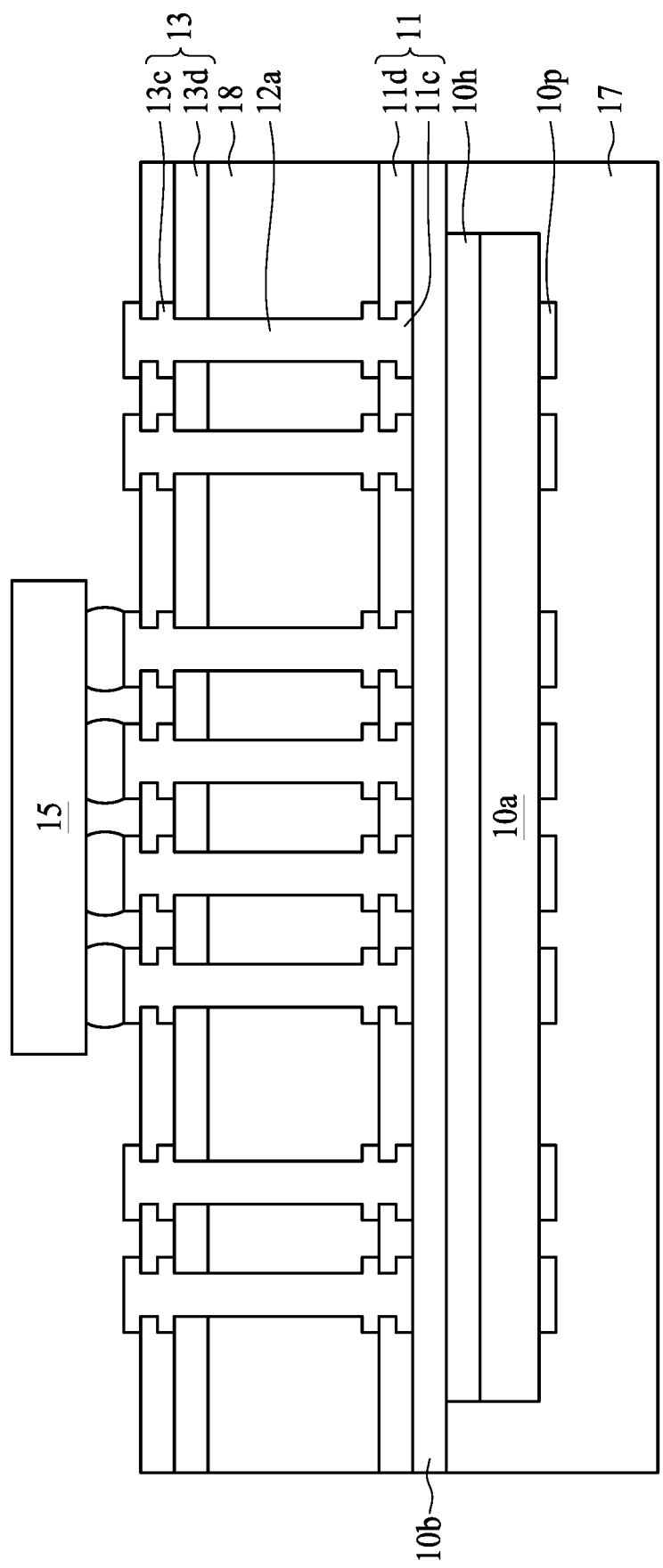

Referring to FIG. 5D, the carrier 59 is removed from the package body 18. A portion of the package body 18 is removed by, for example grinding or any other suitable processes to expose the interconnection structures 12a. A circuit layer 13 including one or more conductive layers 13c and one or more dielectric layer 13d is formed on the package body 18 and electrically connected to the interconnection structures 12a exposed from the package body 18. An electronic component 15 is then disposed on the circuit layer 13. In some embodiments, the active surface of the electronic component 15 is connected to the circuit layer 13 through, for example, flip-chip or any other suitable processes.

Figure 5E:
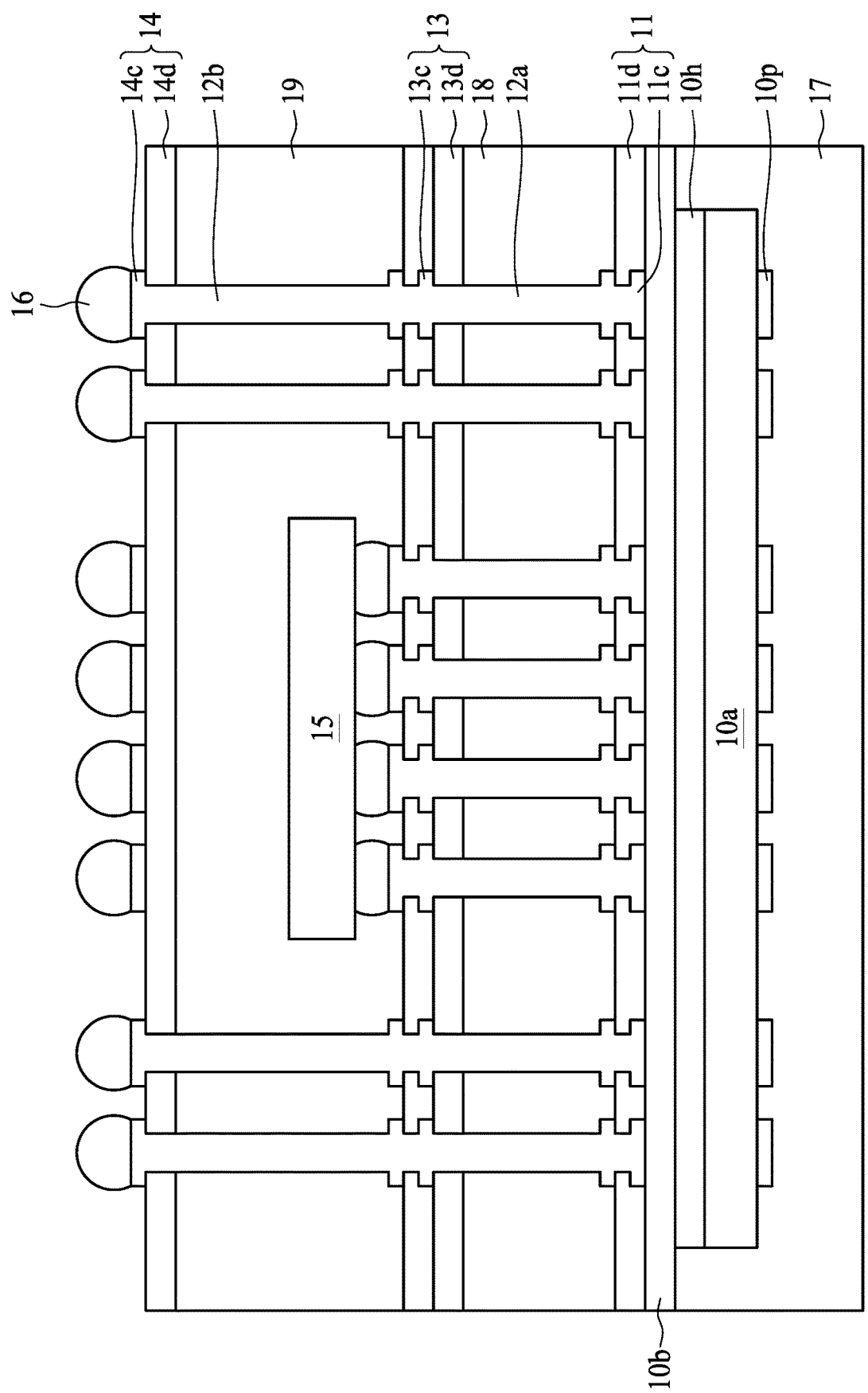

Referring to FIG. 5E, interconnection structures 12b are formed on the circuit layer 13 and electrically connected to the circuit layer 13. In some embodiments, the interconnection structures 12b may be formed by, for example but is not limited to, plating technique. A package body 19 is formed on the circuit layer 13 to cover the interconnection structures 12b and the electronic component 15. In some embodiments, the package body 19 may be formed to fully cover the interconnection structures 12b, and then a portion of the package body 19 is removed by, for example, grinding or any other suitable techniques to expose a top portion of the interconnection structures 12b for electrical connections. In some embodiments, the package body 19 is formed by, for example, by a transfer molding technique, a compression technique or any other suitable techniques.

A circuit layer 14 including one or more conductive layers 14c and one or more dielectric layers 14d is formed on the package body 18 and electrically connected to the interconnection structures 12b exposed from the package body 18. The dielectric layer 14d is formed by, for example but is not limited to, photolithographic technique. Electrical contacts 16 are then disposed on the conductive layer 14c exposed from the dielectric layer 14d.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a first circuit layer having a first surface and a second surface opposite to the first surface;
   a first emitting device disposed on the second surface of the first circuit layer, the first emitting device having a first surface facing the first circuit layer and a second surface opposite to the first surface, the first emitting device having a first conductive pattern disposed on the first surface of the first emitting device; and a second emitting device disposed on the second surface of the first emitting device, the second emitting device having a first surface facing the second surface of the first emitting device and a second surface opposite to the first surface, the second emitting device having a second conductive pattern disposed on the second surface of the second emitting device, wherein a coefficient of thermal expansion (CTE) of the first emitting device is greater than a CTE of the second emitting device.

2. The semiconductor device package of claim 1, wherein a lateral surface of the first circuit layer is substantially coplanar with a lateral surface of the first emitting device.

3. The semiconductor device package of claim 1, wherein a lateral surface of the second emitting device is recessed from a lateral surface of the first emitting device.

4. The semiconductor device package of claim 1, wherein a width of the second emitting device is less than a width of the first emitting device.

5. The semiconductor device package of claim 1, wherein a thickness of the second emitting device is greater than a thickness of the first emitting device.

6. The semiconductor device package of claim 1, wherein a roughness of a lateral surface of the second emitting device is less than a roughness of a lateral surface of the first emitting device.

7. The semiconductor device package of claim 1, further comprising an adhesive layer disposed between the second surface of the first emitting device and the first surface of the second emitting device.

8. The semiconductor device package of claim 7, wherein a lateral surface of the adhesive layer is substantially coplanar with a lateral surface of the second emitting device.

9. The semiconductor device package of claim 1, wherein the first emitting device includes a first glass carrier and the second emitting device includes a second glass carrier.

10. The semiconductor device package of claim 9, wherein a CTE of the first glass carrier is greater than a CTE of the second glass carrier.

11. The semiconductor device package of claim 1, further comprising:
a first set of conductive pillars disposed on the first surface of the first circuit layer; and
a first package body disposed on the first surface of the first circuit layer and covering the first set of conductive pillars.

12. The semiconductor device package of claim 11, further comprising:
a second circuit layer disposed on the first package body;
a second set of conductive pillars disposed on the second circuit layer; and
a second package body disposed on the second circuit layer and covering the second set of conductive pillars.

13. The semiconductor device package of claim 12, further comprising an electronic component disposed on the second circuit layer, the electronic component having an active surface facing the second circuit layer and electrically connected to the second circuit layer.

14. A semiconductor device package, comprising:
a building-up circuit having a first surface and a second surface opposite to the first surface;
a first emitting device disposed on the second surface of the building-up circuit, the first emitting device having a first surface facing the building-up circuit and a second surface opposite to the first surface, the first emitting device having a first conductive pattern disposed on the first surface of the first emitting device; and
a second emitting device disposed on the second surface of the first emitting device, the second emitting device having a first surface facing the second surface of the first emitting device and a second surface opposite to the first surface, the second emitting device having a second conductive pattern disposed on the second surface of the second emitting device,
wherein a thickness of the second emitting device is greater than a thickness of the first emitting device.

15. The semiconductor device package of claim 14, further comprising an encapsulant encapsulating a lateral surface of the second emitting device and exposing a lateral surface of the first emitting device.

16. The semiconductor device package of claim 14, further comprising an adhesive layer disposed between the second surface of the first emitting device and the first surface of the second emitting device.

17. The semiconductor device package of claim 14, wherein a lateral surface of the second emitting device is recessed from a lateral surface of the first emitting device.

18. The semiconductor device package of claim 14, wherein a roughness of a lateral surface of the second emitting device is less than a roughness of a lateral surface of the first emitting device.

19. The semiconductor device package of claim 16, wherein a lateral surface of the adhesive layer is substantially coplanar with a lateral surface of the second emitting device.

* * * * *